United States Patent [19]

Patel

[11] 4,164,458
[45] Aug. 14, 1979

[54] PRODUCTION OF RADIATION CROSSLINKED POLYMERIC COMPOSITIONS USING DIACETYLENES

[75] Inventor: Gordhanbhai N. Patel, Morris Plains, N.J.

[73] Assignee: Allied Chemical Corporation, Morris Township, N.J.

[21] Appl. No.: 775,150

[22] Filed: Mar. 7, 1977

[51] Int. Cl.$^2$ .................. C08F 255/00; B01J 1/10
[52] U.S. Cl. .................. 204/159.17; 204/159.14; 204/159.15; 204/159.16; 204/159.19; 260/4 R
[58] Field of Search .................. 204/159.17, 159.20, 204/159.14, 159.15, 159.16

[56] References Cited

U.S. PATENT DOCUMENTS

| | | | |
|---|---|---|---|
| 3,822,134 | 7/1974 | Rasch et al. | 96/94 R |
| 3,835,004 | 9/1974 | Kagiya et al. | 204/159.17 |
| 3,894,928 | 7/1975 | Kagiya et al. | 204/159.17 |
| 3,923,621 | 12/1975 | Murayama et al. | 204/159.17 |

FOREIGN PATENT DOCUMENTS 2187816  1/1974  France .................. 204/159.17

*Primary Examiner*—Richard B. Turer
*Attorney, Agent, or Firm*—Robert J. North; Gerhard H. Fuchs

[57] ABSTRACT

Crosslinked polymeric compositions, useful as electrical insulators, heat shrinkable packaging, and lightweight foam plastics, are described. The crosslinked polymeric compositions are produced by admixing a diacetylene monomer, oligomer, polymer or mixture thereof, wherein the monomer has the formula, RNHCO—O—CH$_2$—C≡C—C≡C—CH$_2$—O—OCNHR' in which R and R' are the same or different and are alkyl containing 1 to 20 carbon atoms, with a thermoplastic crosslinkable polymer and then subjecting the resulting mixture to actinic radiation.

13 Claims, No Drawings

PRODUCTION OF RADIATION CROSSLINKED POLYMERIC COMPOSITIONS USING DIACETYLENES

BACKGROUND OF THE INVENTION

1. Field of the Invention

This invention relates to radiation-induced crosslinking of polymers using diacetylenes as sensitizing agents.

2. Brief Description of the Prior Art

The crosslinking of polymers is a technique well known in the art, which is normally achieved either by chemical treatment with a free radical reagent or treatment with actinic radiation and results in crosslinked polymers useful as fabricated products. Crosslinking by chemical treatment is relatively inexpensive compared to crosslinking induced by radiation, but radiation-induced crosslinking has a significant advantage in one respect in that one can, if desired, produce higher concentrations of crosslinked polymer in localized regions in the fabricated product. For instance, in a rubber stamp, it is desired to have a hard surface as the image to be stamped, but it is also desirable to have a softer spongy undersurface for flexibility when impressing the stamp upon a surface. Another example is the sole of a shoe where it is desired to have a hard surface for firmness and traction, but a softer spongy undersurface for wearing comfort.

Crosslinked polymers typically show higher dimensional and thermal stability, tensile strength and solvent resistivity than uncrosslinked polymers. These polymers find a number of important industrial uses as in heat shrinkable tubing which is used for a variety of applications, including electrical insulation and also for the packaging of various materials. When a polymer is subjected to actinic radiation, such as gamma radiation, a number of chemical changes occur like crosslinking, chain degradation, and the formation of radicals and unsaturated centers. The term crosslinking refers to the union of high polymer molecules by a system involving primary chemical bonds. These bonds are usually carbon to carbon bonds which are formed between the polymer chains resulting from the breaking of carbon to hydrogen bonds in the individual polymer molecules. Crosslinking has the effect of binding polymer chains into a single network so that it becomes functionally a single molecule, i.e., it changes the thermoplastic properties of a polymer to thermosetting ones.

The cost of radiation-induced crosslinking of polymers can be reduced by incorporating crosslinking accelerators, which are also called crosslinking agents or sensitizers, into the polymer. Radiation-induced crosslinking is carried out with actinic radiation, which is usually gamma radiation produced by a radioactive cobalt source, and is relatively expensive. The use of a sensitizer or accelerator agent, such as the diacetylenes of this invention, acts to accelerate the rate at which crosslinking occurs and thus, reduces the amount of radiation needed to produce the same quantity of crosslinking, and thus substantially lowers the cost of the process. Sensitizers are also useful in promoting crosslinking reactions in some polymers, e.g. isobutylene, in which chain degradation would otherwise result upon irradiation in the absence of a sensitizer or crosslinking agent. Sensitizers for use in radiation-induced crosslinking are well known in the art.

Acetylene is a known sensitizer for radiation induced crosslinking and is exemplified in Kagiya, et al., Janapese Pat. No. 74 05,608 (1974), where it is used as a sensitizer for the crosslinking of methyl methacrylate-vinyl chloride graft copolymer.

Propiolic acid is another acetylene derivative used as a sensitizer and is exemplified in kagitani, et al., Japanese Pat. No. 74 23,581 (1974), in which polyethylene and polypropylene is crosslinked with ionizing radiation in the presence of propiolic acid.

Dipropargyl phthalate is also a known sensitizer and is exemplified in Okamoto et al., Japanese Pat. No. 74 44,577 (1974) where dipropargyl phthalate is used for sensitizing the crosslinking of polyolefins.

Propargyl alcohol is also a known crosslinking agent as exemplified in French Pat. No. 2187-816 (1974), which illustrates the use of this alcohol as a sensitizer in the crosslinking of ethylenic polymers.

Another sensitizing agent containing terminal acetylene groups is exemplified in West German Patent DT 2308-576 (1974) where various acetylene derivatives of s-triazine are used for the crosslinking of poly-alpha olefins.

The above sensitizing agents, however, all contain terminal acetylene groups, which could, when incorporated into the final fabricated product, render the product sensitive to the action of acids and alkalies. This results in discoloration and marring of the surface of the fabricated article due to the chemical interaction between the terminal acetylene groups and acids and alkalies.

Rasch, et al. in U.S. Pat. No. 3,822,134 (1974) disclose the use of diacetylenes as compounds capable of forming colored images upon exposure to radiation on surfaces, after vapor deposition of the diacetylene upon the surface. However, the use of diacetylenes as sensitizing agents for the crosslinking of polymers is not suggested.

Non-terminal diacetylenes of the formula $[Y-O-(CH_2)_n-C\equiv C-]_2$ in which n is 1 and Y is hydrogen and p-toluene-sulfonyl, and non-terminal diacetylenes of the formula $[Q-NHCO-O-(CH_2)_n-C\equiv C-]_2$ in which n is 1 and Q is phenyl and substituted phenyl, and wherein n is 2 or an integer greater than 2 and Q is alkyl, phenyl and substituted phenyl, have been found to be unsuitable as accelerating agents during the radiation-induced crosslinking of polymers.

However, a new class of diacetylene sensitizing agents useful in radiation-induced crosslinking has been discovered which does not contain terminal acetylene groups with their attendant disadvantages.

SUMMARY OF THE INVENTION

According to this invention, there is provided a method for producing crosslinked polymeric compositions, useful as electrical insulators, heat shrinkable packaging and lightweight foam plastics, which comprises the steps of admixing a diacetylene monomer, oligomer, polymer or mixture thereof, wherein the monomer has the formula, $RNHCO-O-CH_2-C\equiv C-C\equiv C-CH_2-O-OCNHR'$, in which R and R' are the same or different and are alkyl containing 1 to 20 carbon atoms, with a thermoplastic crosslinkable polymer and then subjecting the resulting mixture to actinic radiation.

Also provided are crosslinked polymeric compositions comprising an irradiated product of a thermoplastic crosslinkable polymer admixed with a diacetylene monomer, oligomer, polymer or mixture thereof, wherein the monomer has the formula RNHCO—O—CH$_2$—C≡C—C≡C—CH$_2$—O—OCNHR', in which R and and R' are the same or different and are alkyl containing 1 to 20 carbon atoms.

DETAILED DESCRIPTION OF THE INVENTION AND PREFERRED EMBODIMENTS

Diacetylene monomers, oligomers, polymers or mixtures thereof, wherein the monomers have the formula, RNHCO—O—CH$_2$—C≡C—C≡C—CH$_2$—O—OCNHR', in which R and R' are the same or different and are alkyl containing 1 to 20 carbon atoms, act as sensitizing agents for accelerating the radiation-induced crosslinking of thermoplastic crosslinkable polymers. In performing such function, they do not leave behind residues which contain terminal acetylene groups, as is the case with propargyl alcohol and dipropargyl maleate.

Throughout this disclosure the term, diacetylene compounds, where used, is meant to include diacetylene monomers, oligomers, polymers and mixtures thereof, wherein the monomer is defined by the formula given above.

It is preferred to admix the diacetylene compound with the thermoplastic crosslinkable polymer in the molten state, which can be accomplished, for example, by melt blending. After the diacetylene compound is adequately dispersed throughout the molten polymer, the mixture is generally cooled to a temperature between room temperature and about 100° C.

The cooling is employed to cause a substantial amount of the molten diacetylene compound to solidify before irradiation, since irradiation of solid diacetylene compound, in admixture with the polymer, generally produces more efficient crosslinking. It is preferred to cool until the diacetylene compound is at least about 50% by weight in the solid state, and preferably at least about 80 percent by weight in the solid state.

The thermoplastic crosslinkable polymers which are applicable in the instant invention constitute a broad range of polymers. By the term "crosslinkable polymers" is meant that class of homopolymers and copolymers, which is capable of undergoing crosslinking upon irradiation in the presence of diacetylene compounds. In general, these polymers possess at least one C—H bond in their repeating units, as for example in polyethylene, polyvinyl chloride and polyethylene terephthalate, wherein the carbon atom of the C—H bond is situated in the polymer backbone.

The term "polymer backbone" as used herein refers to the basic "skeleton" of the polymer chain which is formed by the interconnecting "repeating" units of the polymer. The longest continuous line which can be hypothetically drawn through the covalent bonds connecting the atoms in the repeating units of the polymer, without doubling back or returning, will in general constitute the "backbone" of the polymer, as the term is understood in the art, and will include all the atoms comprising the polymer backbone but will exclude end groups at each end of the backbone, since these ends can be varied without changing the inherent nature of the polymer backbone. Thus, for example, in the polymer polymethylacrylate, eg.

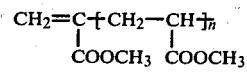

the end methyl acrylate residue outside of the bracket is not taken as part of the polymer backbone, but the carbon atoms of the CH$_2$ and C—H groups within the bracket, e.g. the repeating unit, are in the polymer backbone. Polydiacetylenes do not contain C—H bonds having a carbon atom in the polymer backbone by this formulation, and thus are not included in the category of thermoplastic crosslinkable polymers of this invention.

The polymers applicable in the instant invention can be formed by conventional polymer syntheses such as chain growth mechanism, as in the case of polyolefins and polyacrylates, and a step growth mechanism, as in the case of polyesters, derived from diacids and polyols, and polyamides derived from diacids and diamines.

Included among the polymers applicable in the instant invention are linear homopolymers containing repeating units of the same chemical constitution. Included in this category is styrene-maleic anhydride copolymer, for it is essentially a perfectly alternating sequence of styrene and maleic anhydride units in the polymer chain, and constitutes repeating units of the same chemical constitution.

Also included in the invention are block, random, graft and branched copolymers comprised of two or more repeating units in the polymer chain.

Block copolymers are characterized by long, linear sequences of one monomer unit followed by long linear sequences of another such as styrene-isoprene block copolymer.

Random copolymers are characterized by an arrangement of two or more monomer units in a statistically random placement along a linear chain as for example, styrene-1,3-butadiene random copolymer. Graft and branched copolymers are characterized by a homopolymer, having another homopolymer, affixed thereto at random points along its polymer backbone.

In general, branched copolymers are formed by polymerizations in which secondary processes, sometimes not desired, operate to form branched groups in the desired polymer backbone. Graft copolymers in general are specifically prepared such that desired groups are affixed to the main polymer backbone, by the details of the process and by proper choice of reacting monomers. An example of a branched copolymer is polyethylene prepared by free-radical polymerization of ethylene under high pressure, wherein the resulting polyethylene backbone has affixed 1-pentene and 1-hexene units thereto. An example of a graft copolymer is polystyrene which has methyl methacrylate grafted thereon forming polystyrene-polymethylmethacrylate graft copolymer.

Other representative examples of polymers which can be utilized in the present invention are linear homopolymers and copolymers of polyethylene, polypropylene, polystyrene, polyacrylates, polyacrylamide, polyvinyl chloride, polyamides, such as polycaprolactam and polyhexamethylene adipamide, polyesters such as polyethylene terephthalate and polybutylene terephthalate, polyvinyl pyrrolidone, natural rubber, polyisoprene, polybutadiene, polysiloxanes, polyvinyl alcohol, polyacrolein, polyacrylic acid, polyvinyl alkyl ethers, polyvinyl methyl ketone, polymethylene, chlorinated polyethylene, chlorosulfonated polyethylene, polyacrylonitrile, sulfonated polystyrene, polyethylene oxide, polyisobutylene, poly-alpha-methyl styrene, polymethacrylates, polymethacrylamide, polyvinylidene chloride, polymethacrylic acid, poly-alpha-methacrylonitrile, copolymers such as styrene-maleic anhydride, ethylene-styrene, ethylene-maleic anhydride, ethylene-tetrafluoroethylene, ethylene-chlorotrifluoroethylene, and hexafluoroisobutylene-vinylidene fluoride. Where the copolymer contains two or more different repeating units, one of the units must contain C—H bonds, wherein the carbon atom is present in the polymer backbone, and the unit is present in at least about 5 weight percent of the copolymer, because below this value, the efficiency and extent of crosslinking is greatly reduced. Included among the polymers applicable in the instant invention are those which normally undergo chain degradation upon irradiation in the absence of a crosslinking agent, such as isobutylene and polyethylene terephthalate, but do undergo crosslinking in the presence of an accelerator under irradiation.

Preferred among the polymers in the instant invention are the homopolymers and copolymers of polyolefins and include polyethylene, polypropylene, polyisobutylene, polyisoprene, poly-butadiene, chlorinated polyethylene, chloro-sulfonated polyethylene, and the following copolymers, ethylene-stryene, styrene-butadiene, maleic anhydride, ethylene-tetrafluoroethylene, ethylene-chlorotrifluoroethylene and hexafluoroisobutylene-vinylidene fluoride. Particularly preferred among the polyolefins is polyethylene.

The diacetylene monomers which are applicable in the instant invention are those of the formula RNHCO—O—$CH_2$—C≡C—C≡C—$CH_2$—O—OCNHR', in which R and R' are the same or different and are alkyl containing 1 to 20 carbon atoms, which monomers may be designated as 2,4-hexadiyn-1,6-diol dialkylurethanes. The alkyl groups, R and R', can be either linear or branched. Representative examples of linear alkyl groups are methyl, ethyl, propyl, butyl, pentyl, hexyl, heptyl, octyl, nonyl, decyl, dodecyl, pentadecyl, hexadecyl, octadecyl and eicosanyl. Representative examples of branched alkyl groups include isopropyl-, secondary- and tertiary-butyl, iso-, secondary- and tertiary-dodecyl, and iso-, secondary- and tertiary octadecyl. Preferred among the alkyl groups are those which are linear containing 1 to 12 carbon atoms and particularly preferred are ethyl, butyl and hexyl. Two diacetylene monomers which are particularly preferred are 2,4-hexadiyn-1,6-diol bis(n-butylurethane) and 2,4-hexadiyn-1,6-diol bis(ethylurethane.) The alkyl group, R and R', can be the same or different in the same molecule as in 2,4-hexadiyn-1,6-diol ethyl-n-butyl-urethane. The symmetrical compounds in which both alkyl groups are the same, are however, preferred.

Diacetylene oligomers are also applicable in the invention and are comprised of partially polymerized diacetylene monomers of the formula as described above. Oligomers are the dimers, trimers, tetramers and pentamers of the diacetylene monomers produced by partial irradiation or thermal annealing of the diacetylene monomer. The term "oligomer" as used herein is meant to include not only the pure oligomer itself, eg. dimer, trimer, tetramer or pentamer, but also mixtures thereof.

Diacetylene polymers are also applicable and are more completely polymerized than the oligomers, being at least hexamers of the diacetylene monomer of the formula described above, and include higher degrees of polymerization. The diacetylene polymers are produced by subjecting the diacetylene monomers to actinic radiation or thermal annealing.

Among the monomers, oligomers, polymers or mixtures thereof, it is preferred to use the monomers as sensitizing agents.

The term diacetylene compounds which is used herein comprises monomers, oligomers, polymers and mixtures thereof, and can all be utilized to initiate crosslinking. In general, when a diacetylene monomer is polymerized, usually a mixture of unreacted monomer, partially polymerized oligomers and more are intended to be included within the scope of the invention.

In the invention, the amount of diacetylene compound employed as a sensitizing agent is about 0.001 to 10 percent by weight of the crosslinkable polymer. Preferably, about 1 to 3 percent by weight of diacetylene compound to polymer is used for accelerating the crosslinking, wherein the diacetylene compound comprises diacetylene monomers, oligomers and polymers.

By the term actinic radiation is meat that radiation which is capable of causing a chemical change when absorbed by a substrate and is meant to include visible, ultraviolet, and far ultraviolet radiation, X-rays, alpha, beta and gamma rays. It is preferred to use gamma radiation, and more preferably that gamma radiation produced from a radioactive cobalt source. The actinic radiation is applied in dosages expressed in rads, which is that unit of radiation that results in the absorption of 100 ergs of energy per gram of irradiated material, regardless of the source of radiation and 1 Mrad is one megarad or one million rads. Usually, about 0.1 to 10 Mrads of radiation is employed, but it is preferred to subject the polymer to radiation dosages of about 0.5 to 5 Mrads. For convenience, the irradiation apparatus can be calibrated to deliver a dosage of 1 Mrad/hr., and therefore if a dosage of 0.5 Mrad is desired, the irradiation conducted on the sample for a total of 30 minutes.

The irradiation by actinic radiation in the invention can be carried out in air at atmospheric pressure or under partial vacuum. Irradiation under vacuum in the presence of a crosslinking agent enhances the crosslinking efficiency of some polymers, such as polyvinyl chloride, in contrast to irradiation in air at atmospheric pressure.

The extent of crosslinking of a particular crosslinkable polymer after irradiation is measured indirectly by solvent extraction. In general, uncrosslinked polymer is substantially more soluble than crosslinked polymer and extraction with a suitable solvent is a convenient method to determine the extent of crosslinking. The crosslinked polymer is referred to as gel, and the extent of crosslinking is referred to as percent gel, which is the weight percent of the starting polymer insoluble in the extracting solvent, after irradiation.

For example, when 2 weight percent of 2,4-hexadiyn-1,6-diol bis(n-butylurethane), (HDDBU), is admixed with polyethylene and irradiated with gamma radiation of 3.0 Mrads, the product is extracted with boiling xylene and the xylene extract is found to contain 20 weight percent of the original starting polymer. Thus, a percent gel of 80 percent is produced by irradiation with 3.0 Mrads at a 2 weight percent loading of HDDBU. Conversely, irradiation of the polyethylene with 3.0 Mrads in the absence of HDDBU only produces a 5 percent gel. It has been found that at dosages of 0.1, 0.2, 0.3, 0.4, 0.6, 0.8, 1.0, 2.0, 4.0, 6.0, 10, 20, 30 and 40 Mrads, irradiating the polyethylene with 2 weight percent HDDBU gel of each of the resulting products, which indicates the extent of crosslinking, is set forth in Table I.

TABLE

| Example | Diacetylene | State of Diacetylene | Percent Gel |
|---|---|---|---|
| 1. | 2,4-hexadiyn-1,6-diol bis(n-butylurethane) | Monomer | 66.8 |
| 2. | " | Oligomer | 71.4 |
| 3. | " | Polymer | 71.8 |
| 4. | 2,4-hexadiyn-1,6-diol bis (ethylurethane) | Monomer | 53.3 |
| 5. | 2,4-hexadiyn-1,6-diol bis (phenylurethane) | " | 0.0 |
| 6. | 2,4-hexadiyn-1,6-diol | " | 0.0 |
| 7. | 2,4-hexadiyn-1,6-diol bis(p-toluene sulfonate) | " | 0.0 |
| 8. | 3,5-octadiyn-1,8-dio bis (ethylurethane) | " | 0.0 |
| 9. | 4,6-decadiyn-1.10-diol bis (ethylurethane) | " | 0.0 |
| 10. | 5,7-dodecadiyn-1,12-diol bis (phenylurethane) | " | 0.0 |
| 11. | 5,7-dodecadiyn-1,12-diol bis(ethylurethane) | " | 0.0 |
|  | Control (polyethylene alone) | — | 0.0 | at room temperature in air produces significantly higher percent gels as contrasted to the same dosage in the absence of HDDBU. The preferred percent gel is at least about 50%.

The extent of produced crosslinking is determined by the weight of diacetylene compound in the polymer and the radiation dosage. It is preferred to use about 1 to 3 weight percent of diacetylene compound to polymer, and then subjecting the polymer to about 0.5 to 5 Mrads of radiation to achieve at least about 50% of crosslinked polymer.

The crosslinked polymer compositions containing the diacetylene compound include the crosslinkable polymers described herein where a diacetylene monomer, oligomer, polymer or mixture thereof, wherein the monomer has the formula, $RNHCO-O-CH_2-C\equiv C-C\equiv C-CH_2-O-OCNHR'$, in which R and R' are the same or different and are alkyl containing 1 to 20 carbon atoms, is admixed with the crosslinkable polymer and then subjected to actinic radiation.

The following example is merely illustrative of the invention and is not to be constructed as a limitation upon the scope or spirit of the invention. In the example, parts are by weight.

EXAMPLES 1-11

These Examples illustrate the effectiveness of 2,4-hexadiyn-1,6-diol dialkylurethanes as crosslinking agents in radiation-induced crosslinking as compared to other structurally analogous diacetylenes which are unsuitable for that purpose.

In these examples, 245 parts of polyethylene was milled at 160° C. in a conventional hot mill. To this was added 5 parts of various monomeric, oligomeric and polymeric diacetylenes, described in Table I, and the molten mixture was milled further to achieve thorough mixing. The molten polyethylene/diacetylene mixture was removed from the mill and allowed to cool at room temperature and was then molded into plaques of about 30 mils thick under the action of a hot press. The molded plaques were then irradiated with gamma rays from a $Co^{60}$ source, using 1 Mrad of radiation in air and at room temperature. After the irradiation, trapped radicals, formed by irradiation, were decayed by annealing the plaque at 110° C. for 6 hours in air. The plaques were then extracted in boiling xylene for 10 hours to extract uncrosslinked polymer for the determination of percent gel. The resultant insoluble crosslinked polyethylene was then dried under vacuum at 60° C. A control run was also conducted wherein polyethylene was irradiated in the above procedure in the absence of a diacetylene sensitizing agent. The percent

I claim:

1. A method for producing a crosslinked polymeric composition which comprises the steps of admixing a diacetylene monomer, oligomer, polymer or mixture thereof, wherein the monomer has the formula, $RNHCO-O-CH_2-C\equiv C-C\equiv C-CH_2-O-OCNHR'$, in which R and R' are the same or different and are alkyl containing 1 to 20 carbon atoms, with a thermoplastic crosslinkable polymer and then subjecting the resulting mixture to actinic radiation or high energy ionizing radiation.

2. The method of claim 1 wherein both R and R' are the same.

3. The method of claim 1 wherein R and R' are linear alkyl containing 1 to 12 carbon atoms.

4. The method of claim 1 wherein the diacetylene monomer is 2,4-hexadiyn-1,6-diol bis(n-butylurethane).

5. The method of claim 1 wherein the diacetylene monomer is 2,4-hexadiyn-1,6-diol bis(ethylurethane).

6. The method of claim 1 wherein the diacetylene monomer, oligomer, polymer or mixture thereof is admixed with the thermoplastic crosslinkable polymer in the molten state, and the resultant mixture is cooled prior to radiation.

7. The method of claim 6 wherein the resultant mixture is cooled until the diacetylene monomer, oligomer, polymer, or mixture thereof is at least about 50 percent by weight in the solid state.

8. The method of claim 1 wherein the thermoplastic crosslinkable polymer is a homopolymer or copolymer of a polyolefin.

9. The method of claim 8 wherein the polyolefin is polyethylene.

10. The method of claim 1 wherein the diacetylene monomer, oligomer, polymer or mixture thereof is admixed with the crosslinkable polymer in an amount of about 0.001 to 10 percent by weight of the crosslinkable polymer.

11. The method of claim 10 wherein the diacetylene monomer, oligomer, polymer or mixture thereof, is admixed with the crosslinkable polymer in an amount of about 1 to 3 percent by weight of the crosslinkable polymer.

12. The method of claim 1 wherein the high energy ionizing radiation is gamma radiation.

13. A crosslinked polymeric composition comprising an irradiated product of a thermoplastic crosslinkable polymer admixed with a diacetylene monomer, oligomer, polymer or mixture thereof, wherein the monomer has the formula $RNHCO-O-CH_2-C\equiv C-C\equiv C-CH_2-O-OCNHR'$, in which R and R' are the same or different and are alkyl containing 1 to 20 carbon atoms.

* * * * *